(12) United States Patent
Nakahata et al.

(10) Patent No.: US 8,294,245 B2
(45) Date of Patent: Oct. 23, 2012

(54) GAN SINGLE-CRYSTAL MASS AND METHOD OF ITS MANUFACTURE, AND SEMICONDUCTOR DEVICE AND METHOD OF ITS MANUFACTURE

(75) Inventors: Hideaki Nakahata, Itami (JP); Shinsuke Fujiwara, Itami (JP); Takashi Sakurada, Itami (JP); Yoshiyuki Yamamoto, Itami (JP); Seiji Nakahata, Itami (JP); Tomoki Uemura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 227 days.

(21) Appl. No.: 12/797,617

(22) Filed: Jun. 10, 2010

(65) Prior Publication Data

US 2010/0314625 A1 Dec. 16, 2010

(30) Foreign Application Priority Data

Jun. 10, 2009 (JP) .................. 2009-139304

(51) Int. Cl.
*H01L 29/20* (2006.01)
(52) U.S. Cl. ......... 257/615; 257/E33.023; 257/E29.089; 257/E29.1; 257/E21.085; 257/E21.097; 257/E21.108; 257/E21.117; 257/E33.025
(58) Field of Classification Search .................. None
See application file for complete search history.

(56) References Cited

U.S. PATENT DOCUMENTS

2007/0138909 A1* 6/2007 Mortet et al. ................. 310/318

FOREIGN PATENT DOCUMENTS

| JP | H07-273048 A | 10/1995 |
|---|---|---|
| JP | 2004-047762 A | 2/2004 |
| JP | 2006-060197 A | 3/2006 |
| JP | 2007-223878 A | 9/2007 |

OTHER PUBLICATIONS

R. B. Schwarz et al., "Elastic Moduli of Gallium Nitride," Applied Physics Letters, Mar. 3, 1997, vol. 70, No. 9, pp. 1122-1124, American Institute of Physics, NY.

T. Deguchi et al., "Structural and Vibrational Properties of GaN," Journal of Applied Physics, Aug. 15, 1999, vol. 86, No. 4, pp. 1860-1866, American Insutitute of Physics, NY.

A. Polian et al., "Elastic Constants of Gallium Nitride," Journal of Applied Physics, Mar. 15, 1996, vol. 79, No. 6, American Insititute of Physics, NY.

(Continued)

*Primary Examiner* — Fei Fei Yeung Lopez
(74) *Attorney, Agent, or Firm* — James W. Judge

(57) ABSTRACT

Affords a GaN single-crystal mass, a method of its manufacture, and a semiconductor device and method of its manufacture, whereby when the GaN single-crystal mass is being grown, and when the grown GaN single-crystal mass is being processed into a substrate or like form, as well as when an at least single-lamina semiconductor layer is being formed onto a single-crystal GaN mass in substrate form to manufacture semiconductor devices, cracking is controlled to a minimum. The GaN single-crystal mass 10 has a wurtzitic crystalline structure and, at 30° C., its elastic constant $C_{11}$ is from 348 GPa to 365 GPa and its elastic constant $C_{13}$ is from 90 GPa to 98 GPa; alternatively its elastic constant $C_{11}$ is from 352 GPa to 362 GPa.

5 Claims, 6 Drawing Sheets

OTHER PUBLICATIONS

A. F. Wright, "Elastic Properties of Zinc-Blende and Wurtzite AlN, GaN, and InN," Journal of Applied Physics, Sep. 15, 1997, vol. 82, No. 6, American Insititute of Physics, NY.

Kazuhiro Shimada et al., "First-Principles Study on Electronic and Elastic Properties of BN, AlN, and GaN," Journal of Applied Physics, Nov. 1, 1998, vol. 84, No. 9, American Insititute of Physics, NY.

* cited by examiner

GAN SINGLE-CRYSTAL MASS AND METHOD OF ITS MANUFACTURE, AND SEMICONDUCTOR DEVICE AND METHOD OF ITS MANUFACTURE

BACKGROUND OF THE INVENTION

1. Technical Field

The present invention relates to low-cracking-occurrence GaN single-crystal masses and to methods of their manufacture, as well as to low-cracking-occurrence semiconductor devices incorporating the GaN single-crystal masses and to methods of manufacturing the devices.

2. Description of the Related Art

As a material for short-wavelength optoelectronic devices, power electronic devices, and other semiconductor devices, attention is being focused on bulk single-crystal gallium nitride (GaN), which has a 3.4 eV energy bandgap and a high thermal conductivity.

A problem with such GaN single-crystal masses is that because they are of low toughness despite being highly hard, when the GaN single-crystal is being grown, and/or when the grown GaN single-crystal is being processed into substrate form, and/or when an at least single-lamina semiconductor layer is being formed onto a single-crystal GaN mass in substrate form to fabricate semiconductor devices, cracks will occur in the GaN single-crystal mass and/or in the semiconductor devices, leading to a drop in yield of the platelike GaN single-crystal masses (GaN single-crystal substrates) and/or semiconductor devices.

The elastic constants, meanwhile, of such GaN single-crystal masses have been measured or calculated by a variety of techniques, on crystal obtained by several different growth methods. Examples that may be cited include: R. B. Schwarz et al., "Elastic Moduli of Gallium Nitride," *Applied Physics Letters*, Volume 70, Issue 9, 1997, pp. 1122-1124 (Non-Patent Reference 1); T. Deguchi et al., "Structural and Vibrational Properties of GaN," *Journal of Applied Physics*, Volume 86, Issue 4, 1999, pp. 1860-1866 (Non-Patent Reference 2); A. Polian et al., "Elastic Constants of Gallium Nitride," *Journal of Applied Physics*, Volume 79, Issue 6, 1996, pp. 3343-3344 (Non-Patent Reference 3); A. F. Wright "Elastic Properties of Zinc-Blende and Wurtzite AlN, GaN, and InN," *Journal of Applied Physics*, Volume 82, Issue 6, 1997, pp. 2833-2839 (Non-Patent Reference 4); K. Shimada et al., "First-Principles Study on Electronic and Elastic Properties of BN, AlN, and GaN," *Journal of Applied Physics*, Volume 84, Issue 9, 1998, pp. 4951-4958 (Non-Patent Reference 5).

Non-Patent Reference 1: R. B. Schwarz et al., "Elastic Moduli of Gallium Nitride," *Applied Physics Letters*, Volume 70, Issue 9, 1997, pp. 1122-1124.

Non-Patent Reference 2: T. Deguchi et al., "Structural and Vibrational Properties of GaN," *Journal of Applied Physics*, Volume 86, Issue 4, 1999, pp. 1860-1866.

Non-Patent Reference 3: A. Polian et al., "Elastic Constants of Gallium Nitride," *Journal of Applied Physics*, Volume 79, Issue 6, 1996, pp. 3343-3344.

Non-Patent Reference 4: A. F. Wright, "Elastic Properties of Zinc-Blende and Wurtzite AlN, GaN, and InN," *Journal of Applied Physics*, Volume 82, Issue 6, 1997, pp. 2833-2839.

Non-Patent Reference 5: K. Shimada et al., "First-Principles Study on Electronic and Elastic Properties of BN, AlN, and GaN," *Journal of Applied Physics*, Volume 84, Issue 9, 1998, pp. 4951-4958.

SUMMARY OF THE INVENTION

An object of the present invention is, resolving the problems discussed above, to make available a GaN single-crystal mass, a method of its manufacture, and a semiconductor device and method of its manufacture, whereby when the GaN single-crystal mass is being grown, and when the grown GaN single-crystal mass is being processed into a substrate or like form, as well as when an at least single-lamina semiconductor layer is being formed onto a single-crystal GaN mass in substrate form to manufacture semiconductor devices, cracking is controlled to a minimum.

The present invention in one aspect is a GaN single-crystal mass having a wurtzitic crystalline structure and, at 30° C., whose elastic constant $C_{11}$ is from 348 GPa to 365 GPa and whose elastic constant $C_{13}$ is from 90 GPa to 98 GPa, or whose elastic constant $C_{11}$ is from 352 GPa to 362 GPa. With a GaN single-crystal mass involving the present invention, it is possible to have the resistivity thereof be not greater than $1 \times 10^3 \, \Omega \cdot cm$.

In another aspect, the present invention is a method of manufacturing a GaN single-crystal mass, provided with: a step of placing inside a crystal-growth chamber a source boat for supplying a Ga source material, a substrate, and a quartz component; and a step of growing a GaN single-crystal mass onto the substrate by vapor-phase deposition; wherein in the step of growing the GaN single-crystal mass, the temperature of the source boat is held at from 980° C. to 1040° C., while the temperature of the substrate and the quartz component is held at greater than 1130° C. to not more than 1150° C.

In a further aspect, the present invention is a semiconductor device including an above-described GaN single-crystal mass, and an at least single-lamina Group-III nitride semiconductor layer that is formed onto the GaN single-crystal mass.

In yet another aspect, the present invention is a method of manufacturing a semiconductor device, provided with: a step of preparing an above-described GaN single-crystal mass; and a step of forming an at least single-lamina III-nitride semiconductor layer onto the GaN single-crystal mass.

The present invention makes possible the provision of a GaN single-crystal mass and a method of its manufacture, as well as a semiconductor device and a method of its manufacture, in which cracking when the GaN single-crystal mass is grown and when the grown GaN single-crystal mass is processed into a substrate or like form, as well as when an at least single-lamina semiconductor layer is formed onto the GaN single-crystal mass in substrate form to manufacture semiconductor devices, is controlled to a minimum.

DETAILED DESCRIPTION OF THE INVENTION

Embodying Mode 1

A GaN single-crystal mass 10 that is one mode of embodying the present invention has a wurtzitic crystalline structure, and at 30° C. its elastic constant $C_{11}$ is from 348 GPa to 365 GPa and its elastic constant $C_{13}$ is from 90 GPa to 98 GPa, or its elastic constant $C_{11}$ is from 352 GPa to 362 GPa.

Figure 1:
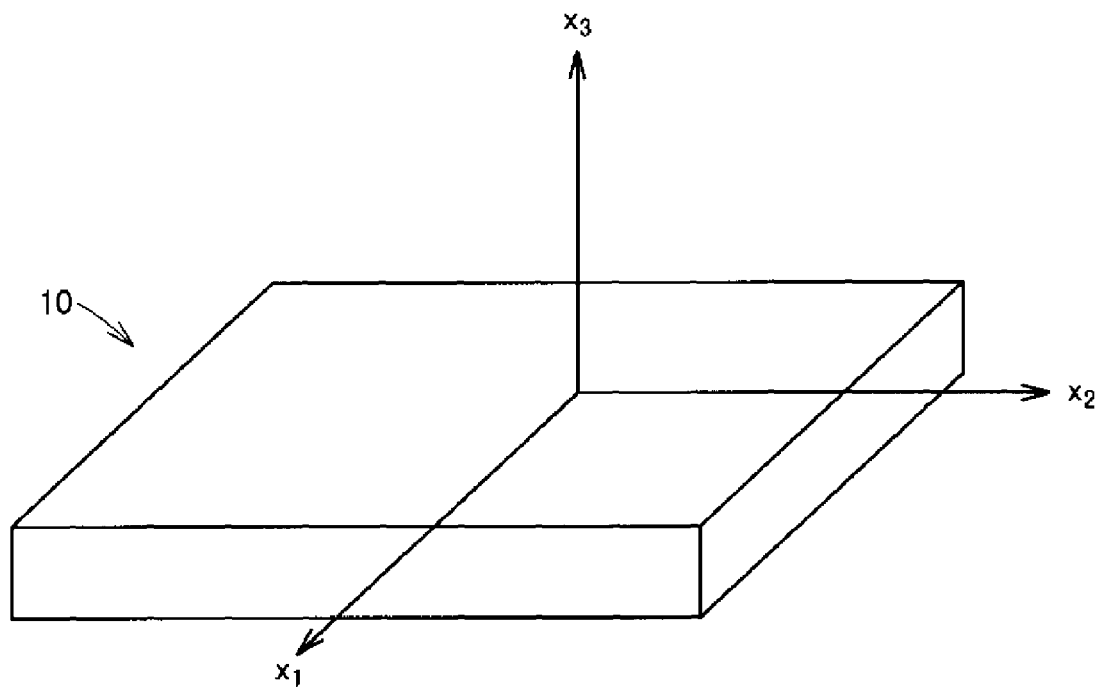
FIG. 1 is a simplified diagram representing an example of an $x_1$ axis, an $x_2$ axis and an $x_3$ axis in a GaN single-crystal mass.

Reference is made to FIG. 1: Viewed macroscopically a GaN single-crystal mass having a crystallographically hexagonal wurtzitic structure exhibits isotropic elastic symmetry in-plane, and the elastic-constant matrix $[C_{ij}]$ when, among the three mutually orthogonal axes—the $x_1$ axis, $x_2$ axis and $x_3$ axis—the thickness orientation (c-axis direction) is taken as the $x_3$ axis, may be described as in the following Formula 1.

Formula 1

$$[C_{ij}] = \begin{bmatrix} C_{11} & C_{12} & C_{13} & 0 & 0 & 0 \\ & C_{11} & C_{13} & 0 & 0 & 0 \\ & & C_{33} & 0 & 0 & 0 \\ & & & C_{44} & 0 & 0 \\ & sym. & & & C_{44} & 0 \\ & & & & & C_{66} \end{bmatrix} \quad (1)$$

Herein, the correspondence between the stress and strain that each elastic constant within the elastic-constant matrix $[C_{ij}]$ represents is for example as follows. The elastic constant $C_{11}$ (first row, first column in $[C_{ij}]$) expresses the elastic stiffness in the direction of the $x_1$ axis when stress in the $x_1$ axial direction is applied to a face perpendicular to the $x_1$ axis. And while the elastic constant $C_{22}$ expresses the elastic stiffness in the direction of the $x_2$ axis when stress in the $x_2$ axial direction is applied to a face perpendicular to the $x_2$ axis, in GaN single-crystal masses having wurtzitic crystalline structures, it is equivalent to the elastic constant $C_{11}$ (second row, second column in $[C_{ij}]$). Likewise, the elastic constant $C_{33}$ (third row, third column in $[C_{ij}]$) expresses the elastic stiffness in the direction of the $x_3$ axis when stress in the $x_3$ axial direction is applied to a face perpendicular to the $x_3$ axis; the elastic constant $C_{12}$ (first row, second column in $[C_{ij}]$) expresses the elastic stiffness in the direction of the $x_2$ axis when stress in the $x_1$ axial direction is applied to a face perpendicular to the $x_1$ axis; and the elastic constant $C_{13}$ (first row, third column in $[C_{ij}]$) expresses the elastic stiffness in the direction of the $x_3$ axis when stress in the $x_1$ axial direction is applied to a face perpendicular to the $x_1$ axis. And while the elastic constant $C_{23}$ expresses the elastic stiffness in the direction of the $x_3$ axis when stress in the $x_2$ axial direction is applied to a face perpendicular to the $x_2$ axis, in GaN single-crystal masses having wurtzitic crystalline structures, it is equivalent to the elastic constant $C_{13}$ (second row, third column in $[C_{ij}]$). Likewise, the elastic constant $C_{44}$ (fourth row, fourth column in $[C_{ij}]$) expresses the elastic stiffness within the $x_2 x_3$ plane when stress in the $x_2$ axial direction is applied to a face perpendicular to the $x_3$ axis, or when stress in the $x_3$ axial direction is applied to a face perpendicular to the $x_2$ axis. And while the elastic constant $C_{55}$ expresses the elastic stiffness within the $x_1 x_3$ plane when stress in the $x_1$ axial direction is applied to a face perpendicular to the $x_3$ axis, or when stress in the $x_3$ axial direction is applied to a face perpendicular to the $x_1$ axis, in GaN single-crystal masses having wurtzitic crystalline structures, it is equivalent to the elastic constant $C_{44}$ (fifth row, fifth column in $[C_{ij}]$). Likewise, the elastic constant $C_{66}$ (sixth row, sixth column in $[C_{ij}]$) expresses the elastic stiffness within the $x_1 x_2$ plane when stress in the $x_1$ axial direction is applied to a face perpendicular to the $x_2$ axis, or when stress in the $x_2$ axial direction is applied to a face perpendicular to the $x_1$ axis. Furthermore, the elastic constant $C_{66}$ is $C_{66}=(C_{11}-C_{12})/2$. Accordingly, in the elastic-constant matrix $[C_{ij}]$ for a GaN single-crystal mass, five independent elastic constants ($C_{11}$, $C_{33}$, $C_{44}$, $C_{66}$, $C_{12}$ and $C_{13}$) exist.

The method whereby the elastic-constant matrix $[C_{ij}]$ for a GaN single-crystal mass is characterized and calculated is not particularly limited, with examples that may be given including resonant ultrasound spectroscopy (RUS), Brillouin spectroscopy, and surface-acoustic wave measurement.

A GaN single-crystal mass of the present embodying mode has a wurtzitic crystalline structure, and has an appropriate elasticity wherein, at 30° C., the elastic constant $C_{11}$ is from 348 GPa to 365 GPa and the elastic constant $C_{13}$ is from 90 GPa to 98 GPa, or the elastic constant $C_{11}$ is from 352 GPa to 362 GPa, and therefore, when the GaN single-crystal mass is grown and when the grown GaN single-crystal mass is processed into a substrate or like form, as well as when an at least single-lamina semiconductor layer is formed onto the GaN single-crystal mass in substrate form to manufacture semiconductor devices, the occurrence of cracks is controlled to a minimum. In this case the elastic constants $C_{11}$ and $C_{13}$ are independent of each other.

Herein, a GaN single-crystal mass in which at 30° C. the elastic constant $C_{11}$ is from 348 GPa to 365 GPa and the elastic constant $C_{13}$ is from 90 GPa to 98 GPa has a suitable degree of elastic stiffness in the $x_1$ axial direction and elastic stiffness in the $x_3$ axial direction when stress in the $x_1$ direction is applied to a face perpendicular to the $x_1$ axis. On the other hand, it has suitable degree of elastic stiffness in the $x_2$ axial direction and elastic stiffness in the $x_3$ axial direction when stress in the $x_2$ direction is applied to a face perpendicular to the $x_2$ axis. Therefore, when such GaN single-crystal mass is grown and when the grown GaN single-crystal mass is processed into a substrate or like form, as well as when an at least single-lamina semiconductor layer is formed onto the GaN single-crystal mass in substrate form to manufacture semiconductor devices, cracking is controlled to a minimum. From the perspective of further curbing the occurrence of cracks, it is preferable that at 30° C. the elastic constant $C_{11}$ is from 352 GPa to 362 GPa, and the elastic constant $C_{13}$ is from 92 GPa to 95 GPa.

Further, a GaN single-crystal mass in which at 30° C. the elastic constant $C_{11}$ is from 352 GPa to 362 GPa has an exceedingly well-suited degree of elastic stiffness in the $x_1$ axial direction when stress in the $x_1$ direction is applied to a face perpendicular to the $x_1$ axis. On the other hand, it has an exceedingly well-suited degree of elastic stiffness in the $x_2$ axial direction when stress in the $x_2$ direction is applied to a face perpendicular to the $x_2$ axis. Therefore, when such GaN single-crystal mass is grown and when the grown GaN single-crystal mass is processed into a substrate or like form, as well as when an at least single-lamina semiconductor layer is formed onto the GaN single-crystal mass in substrate form to manufacture semiconductor devices, cracking is controlled to a minimum.

It should be noted that in respect of conventional GaN single-crystal masses, in literature such as the foregoing Non-Patent References 1 through 5, elastic constants such as i) $C_{11}$ being 377 GPa and $C_{13}$ being 114 GPa, ii) $C_{11}$ being 373 GPa and $C_{13}$ being 80.4 GPa, iii) $C_{11}$ being 390 GPa and $C_{13}$ being 106 GPa, iv) $C_{11}$ being 374 GPa and $C_{13}$ being 70 GPa, v) $C_{11}$ being 367 GPa and $C_{13}$ being 103 GPa, vi) $C_{11}$ being 369 GPa and $C_{13}$ being 66.7 GPa, vii) $C_{11}$ being 396 GPa and $C_{13}$ being 100 GPa, and viii) $C_{11}$ being 350 GPa and $C_{13}$ being 104 GPa, have been reported, but in any of these cases, the elastic constant $C_{11}$ is outside the range of from 348 GPa to 365 GPa, and the elastic constant $C_{13}$, of from 90 GPa to 98 GPa, with the elastic constant $C_{11}$ also being outside the range of from 352 GPa to 362 GPa. Consequently, when a conventional GaN single-crystal mass is grown and when the grown GaN single-crystal is processed into a substrate or like form, as well as when an at least single-lamina semiconductor layer is formed onto the GaN single-crystal mass in substrate form to manufacture semiconductor devices, cracks have often arisen in the conventional GaN single-crystal mass and in the semiconductor devices.

A GaN single-crystal mass of the present embodying mode is not particularly limited in terms of its resistivity, but from the perspective of obtaining highly electroconductive substrates, the resistivity preferably is not greater than $1\times10^3$ $\Omega\cdot$cm, and more preferably, not greater than $1\times10^{-1}$ $\Omega\cdot$cm. In this regard, from the perspective of material properties and current crystal-manufacturing technology, the lower limit of the resistivity of the GaN single-crystal masses is at about the $1\times10^{-3}$ $\Omega\cdot$cm level.

Embodying Mode 2

Figure 2:
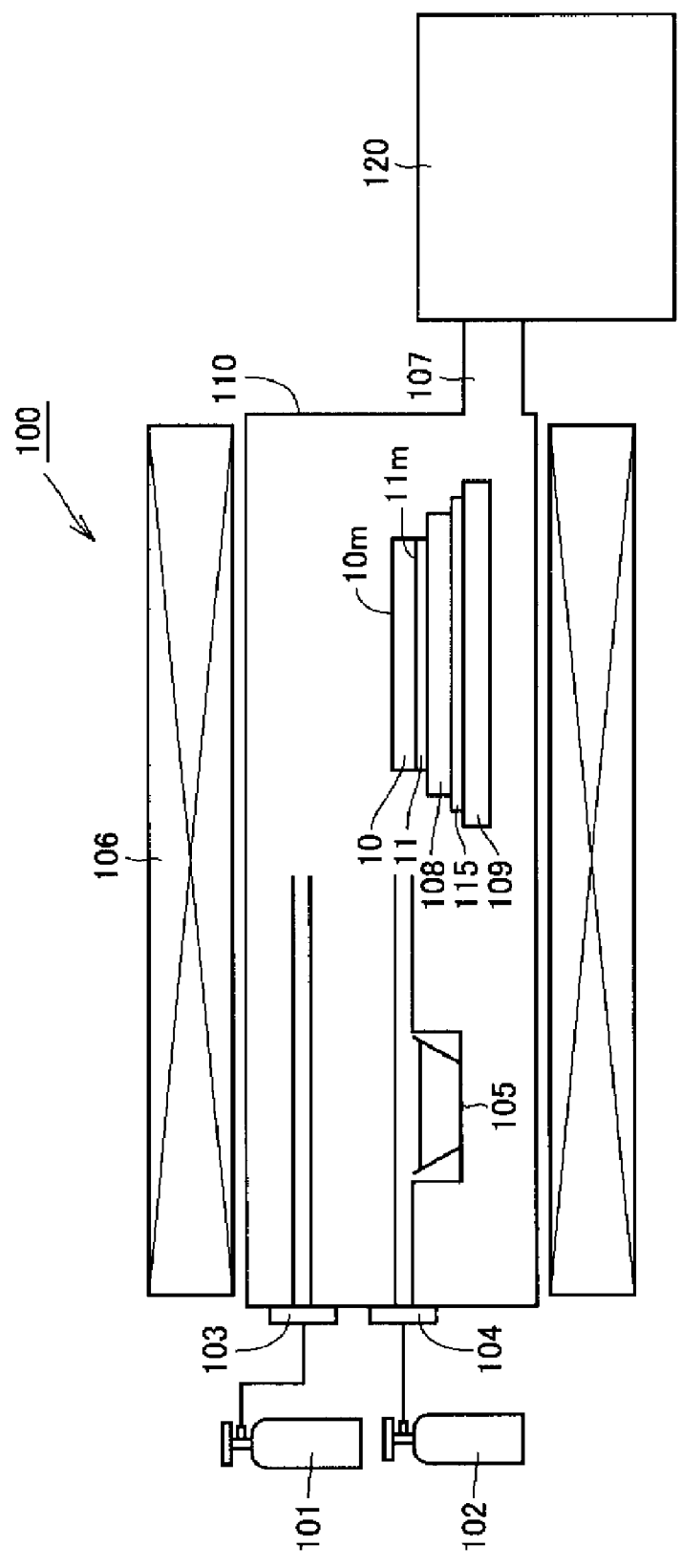
FIG. 2 is a simplified diagram representing an example of a method of manufacturing a GaN single-crystal mass, and a manufacturing apparatus therefor.
Figure 4:
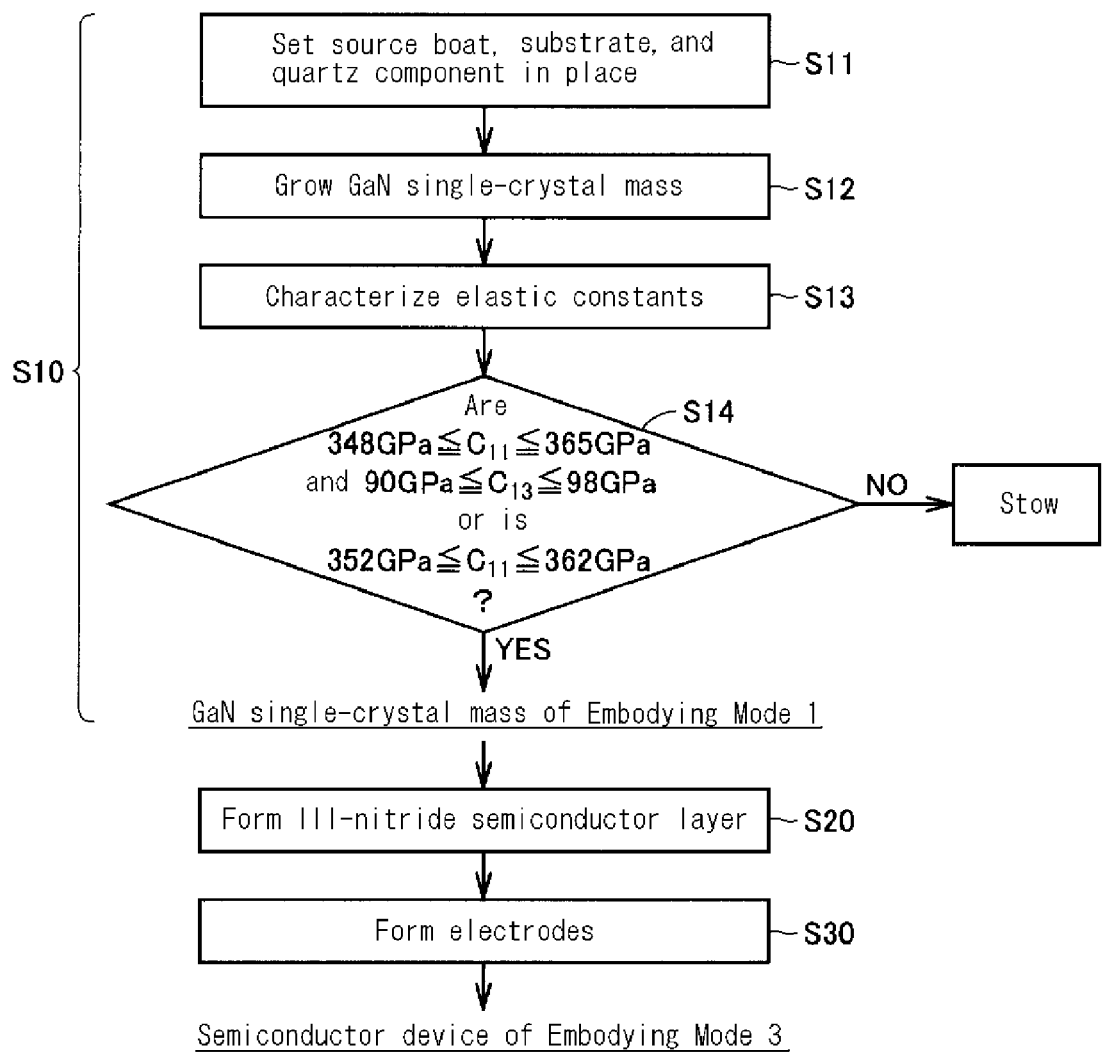
FIG. 4 is a flowchart illustrating an example of a method of manufacturing a GaN single-crystal mass and a semiconductor device.

A GaN single-crystal-mass manufacturing method that is one mode of embodying the present invention is, with reference to FIGS. 2 and 4, provided with: a step S11 of placing inside a crystal-growth chamber 110 a source boat 105 for supplying a Ga source material, a substrate 11, and a quartz component 109; and a step S12 of growing a GaN single-crystal mass 10 onto the substrate 11 by vapor-phase deposition; wherein in the step of growing the GaN single-crystal mass 10, the temperature of the source boat 105 is held at from 980° C. to 1040° C., while the temperature of the substrate 11 and the quartz component 109 is held at greater than 1130° C. to not more than 1150° C.

In a method of the present embodying mode of manufacturing a GaN single-crystal mass, in step S12 of growing a GaN single-crystal mass, having the temperature of the source boat 105 set inside the crystal-growth chamber 110 be from 980° C. to 1040° C., and having the temperature of the substrate 11 and the quartz component 109 be greater than 1130° C. to not more than 1150° C. makes it possible to grow onto the substrate 11 a GaN single-crystal mass 10 of Embodying Mode 1 (that is, a GaN single-crystal mass having a wurtzitic crystalline structure, and, at 30° C., whose elastic constant $C_{11}$ is from 348 GPa to 365 GPa and whose elastic constant $C_{13}$ is from 90 GPa to 98 GPa, or whose elastic constant $C_{11}$ is from 352 GPa to 362 GPa).

Although the detailed mechanism whereby GaN single crystal grows in the manufacturing method of the present embodying mode is obscure, it is believed that by having the temperature of the source boat 105 set inside the crystal-growth chamber 110 be from 980° C. to 1040° C., and having the temperature of the substrate 11 and the quartz component 109 be greater than 1130° C. to not more than 1150° C., appropriate quantities of the quartz compositional constituent substances within the quartz component 109 (meaning—likewise hereinafter—constituent substances that compose quartz, including Si, O, as well as impurities) mix into the GaN single-crystal mass 10 that grows onto the substrate 11, therefore yielding a GaN single-crystal mass having an appropriate elasticity wherein, at 30° C., the elastic constant $C_{11}$ is from 348 GPa to 365 GPa and the elastic constant $C_{13}$ is from 90 GPa to 98 GPa, or the elastic constant $C_{11}$ is from 352 GPa to 362 GPa.

The GaN single-crystal-mass manufacturing apparatus utilized in a manufacturing method of the present embodying mode is not particularly limited; with reference to FIG. 2, exemplarily it is a hydride vapor-phase epitaxy (HVPE) apparatus 100, furnished with: a first gas canister 101, and second gas canister 102, a first gas inlet 103, a second gas inlet 104, the source boat 105, a heater 106, an exhaust-gas port 107, a susceptor 108, a support platform formed by the quartz component 109, the crystal-growth chamber 110, a local-heating device 115, and an exhaust-gas treating unit 120.

The HVPE apparatus 100 may be, for example, a horizontal reactor. The first gas may be, for example, gaseous $NH_3$ (ammonia), with the first gas canister 101 being charged with the gaseous $NH_3$. The second gas may be, for example, gaseous HCl (hydrogen chloride), with the second gas canister 102 being charged with, e.g., the gaseous HCl. The source boat 105 is charged with metallic Ga (gallium), for example. The heater 106, functioning to heat the interior of the crystal-growth chamber 110, controls the temperature of the GaN crystal during its growth. The exhaust-gas port 107 is a component for exteriorly exhausting post-reaction gas (exhaust gas). The exhaust-gas treating unit 120 detoxifies the exhaust gas produced by the growth reactions.

The quartz component 109 that forms the support platform supports the susceptor 108 and the substrate 11. The surface area of such support platform (quartz component 109) preferably is greater than the surface area of the susceptor 108. In implementations where a GaN single-crystal substrate (plate-like GaN single-crystal mass 10) having a major surface 10m (cf. FIG. 3) of 2-inch diameter is manufactured, it is preferable that the major surface of the support platform be 4 inches or more. The susceptor 108 is set onto the support platform (quartz component 109), where it retains the substrate 11. The susceptor 108 is made from, for example, carbon or the like.

It is also preferable that the HVPE apparatus 100 be furnished with the local-heating device 115 in the interior of the crystal-growth chamber 110. For the local-heating device 115, a resistive heating device, for example, can be utilized and can be situated in between the susceptor 108 and the support platform formed by the quartz component 109.

In addition, the HVPE apparatus 100 preferably is furnished with carrier-gas canisters (not illustrated) that are charged with $H_2$ (hydrogen) gas, $N_2$ (nitrogen) gas, Ar (argon) gas, He (helium) gas, etc. as carrier gases for the first and second gases. The carrier gases are supplied, together with the first gas and the second gas, through the first gas inlet 103 and the second gas inlet 104 to the substrate 11.

To continue, an explanation, referring to FIGS. 2 and 4, of a method in the present embodying mode of manufacturing a GaN single-crystal mass 10 will be made. In the present embodying mode, the GaN single-crystal mass 10 is manufactured utilizing the afore-described HVPE apparatus 100.

To begin with, as indicated in FIGS. 2 and 4, the source boat 105 for supplying Ga source material, the substrate 11, and the quartz component 109 are placed inside the crystal-growth chamber 110 (Step S11). The placement of the substrate 11 and the quartz component 109 inside the crystal-growth chamber 110 is not particularly limited, as long as they are disposed in such a way that when the GaN single-crystal mass 10 is grown onto the substrate 11, the quartz compositional constituent substances from the heated quartz component intermix into the GaN single-crystal mass 10; in the HVPE apparatus of FIG. 2, the support platform itself is the quartz component 109. In particular, the substrate 11 is retained by the susceptor 108, while the susceptor 108 is in turn supported by the support platform formed by the quartz component 109.

The substrate 11 is a substrate in order that a GaN single-crystal mass be grown thereon. Examples of substrates that can be utilized include silicon (Si) substrates, sapphire (Al$_2$O$_3$) substrates, silicon carbide (SiC) substrates, gallium arsenide (GaAs) substrates, GaN substrates and aluminum nitride (AlN) substrates. Further, it is preferable that the surface area of the major surfaces of the substrate 11 be not less than 3 cm$^2$; that it exceed 3 cm$^2$ is more preferable still. Likewise, the major surfaces of the substrate 11 preferably have a diameter of not less than 2 inches, for example; more preferably, they has a diameter that exceeds 2 inches.

It is also preferable that a patterned mask be formed onto a major surface of the substrate 11. This means that application may be made of a technique such as epitaxial lateral overgrowth (ELO), dislocation elimination by epi-growth with inverted-pyramidal pits (DEEP), or void-assisted separation (VAS).

The quartz component 109 disposed as a support platform in the crystal-growth chamber 110 interior is not particularly limited, as long as it contains quartz compositional constituent substances (constituent substances that compose quartz—e.g., Si, O, as well as impurities) that are mixed into the GaN single-crystal mass as it is grown onto the substrate, but from the perspective of reducing the intermixing of unintentional impurities into the GaN single-crystal mass, quartz of a high level of purity is preferable. For example, the purity of the quartz is preferably not less than 95 mass %, and more preferably, not less than 99 mass %.

Next, a GaN single-crystal mass is grown onto the substrate 11 (Step S12). Instances where the GaN single-crystal mass is grown by HVPE utilizing the HVPE apparatus illustrated in FIG. 2 are carried out in the following manner, for example. Owing to its rapid crystal-growth rates the HVPE method, by curtailing the growth time, makes it possible to grow a GaN single-crystal mass having considerable thickness.

With the method of growing crystal by HVPE, at first the source boat 105, filled with metallic Ga as a source material, and the substrate 11 are placed inside the crystal-growth chamber 110. In this case, the substrate 11 is set onto the susceptor 108, which has been placed on the support platform formed by the quartz component 109 disposed inside the crystal-growth chamber 110. Subsequently, the interior of the crystal-growth chamber 110 is heated. The second gas inlet 104 is then opened. Next, the second gas, stored in the second gas canister 102 and supplied through the second gas inlet 104, and the source material in the source boat 105 are reacted to generate GaCl (gallium chloride) as a reaction gas. The first gas inlet 103 is subsequently opened. Then the reaction gas and the first gas, stored in the first gas canister 101 and supplied through the first gas inlet 103, are flowed (supplied) so as to strike, and react with, the front side of the substrate 11. Here, the flow of the gases supplied to the substrate 11 preferably is controlled so as to be always constant. Further, the interior of the crystal-growth chamber 110 is heated with the heater 106 and the local-heating device 115 so as to be at a temperature of, for example, from 800° C. to 1200° C. The post-reaction gases meanwhile are exhausted to the exterior via the exhaust-gas port 107.

In Step S12, the heater 106 and the local-heating device 115 are employed to bring the temperature of the source boat 105 to from 980° C. to 1040° C., and the temperature of the substrate 11 and the quartz component 109 to from higher than 1130° C. to 1150° C. This makes it possible to grow, as described above, onto the substrate 11 a GaN single-crystal mass having a wurtzitic crystalline structure, and, at 30° C., whose elastic constant $C_{11}$ is from 348 GPa to 365 GPa and whose elastic constant $C_{13}$ is from 90 GPa to 98 GPa, or whose elastic constant $C_{11}$ is from 352 GPa to 362 GPa.

Herein, in the HVPE apparatus of FIG. 2, the temperature of the local-heating device 115, compared with that of the heater 106, has a greater bearing on adjustment of the temperature of the substrate 11 and the quartz component 109. That is, the temperature of the substrate 11 and the quartz component 109 corresponds roughly to the temperature of the local-heating device. With the thus obtained GaN single-crystal mass, when the crystal is grown and when the grown single-crystal is processed into a substrate or like form, as well as when an at least single-lamina semiconductor layer is grown onto the GaN single-crystal mass in substrate form to manufacture semiconductor devices, cracking is controlled to a minimum.

In implementations where the GaN single-crystal mass is grown by HVPE, also it is preferable that growth abnormalities not arise, and to have the growth rate be 30 µm/h or more. Those conditions enable thick GaN single-crystal masses to be grown stably.

In this Step S12, furthermore, the GaN single-crystal mass is grown variously altering factors relevant to the crystal growth, such as the heating temperature, the volume and type of gases introduced, and the placement within the crystal-growth chamber 110 of the source boat 105, the substrate 11, the susceptor 108, the support-platform-forming quartz component 109, etc. so as to curtail irregularities in crystallinity and impurity concentration.

Again, it is preferable that a carrier gas containing, for example, at least one of high-purity gaseous nitrogen, gaseous hydrogen, gaseous argon or gaseous helium be utilized.

In this Step S12, it is preferable that the crystal be grown in a manner such that the growth direction of the GaN single-crystal mass 10 will be in a <0001> direction or in the proximity of a <0001> direction. The crystal is also grown in such a way that the growth-surface area of the GaN single-crystal mass 10 preferably is not less than 3 cm$^2$, and more preferably exceeds 3 cm$^2$. The crystal is also grown so that the diameter of the major surface 10m (growth face) of the GaN single-crystal mass 10 preferably will be not less than 2 inches, and more preferably will exceed 2 inches. Further, the crystal is grown so that the thickness of the GaN single-crystal mass preferably will be 100 µm or more, and more preferably, 400 µm or more.

It should be understood that the method whereby the GaN single-crystal mass is grown is not limited to HVPE; techniques that can be adopted include such vapor-phase growth techniques as metalorganic chemical vapor deposition (MOCVD) and sublimation deposition, and liquid-phase growth techniques such as flux growth and high-nitrogen-pressure solution growth.

Next, the heating by the heater 106 and the local-heating device 115 is halted to lower to room-temperature level the temperature of the source boat 105, the GaN single-crystal mass 10, and the substrate 11. After that, the GaN single-crystal mass that has formed atop the substrate 11 is taken out from the crystal-growth chamber 110.

Next the substrate 11, at least, is removed from the GaN single-crystal mass 10, to form a platelike GaN single-crystal mass (below, also termed a GaN single-crystal substrate). The crystallinity of the GaN single-crystal mass 10 near its interface with the substrate 11 often is not satisfactory. On that account, manufacturing the GaN single-crystal substrate by further removing the portion of the GaN single-crystal mass where the crystallinity is not satisfactory is to be preferred. Here, in cases where the thickness of the GaN single-crystal mass is considerable, GaN single-crystal substrates may be sliced from the GaN single-crystal mass. And in implementations where the substrate 11 is a GaN substrate, the GaN single-crystal mass grown onto the substrate 11 may be rendered a GaN single-crystal substrate. The foregoing steps make it possible to form GaN single-crystal substrates (platelike GaN single-crystal masses).

For the method whereby at least the substrate 11 is removed from the GaN single-crystal mass 10, such means as severing or grinding, for example, can be employed. Here, "severing" means mechanically separating (slicing) at least the substrate 11 from the GaN single-crystal mass 10 with a device, such as a slicer or wire saw, possessing a peripheral cutting edge on an electroplated diamond wheel. "Grinding" means mechanically shaving off at least the substrate 11 from the GaN single-crystal mass 10 with grinding equipment possessing a diamond grinding wheel, with or other such means.

The surface removed from the GaN single-crystal mass 10 is not limited to the surface parallel with the front side of the substrate 11; a surface having a chosen incline with respect to the front side may be sliced. Herein, in implementations where the GaN single-crystal mass is grown in a <0001> direction, from the perspective of obtaining large-area GaN single-crystal substrates, it is preferable that the major surface 10$m$ have an angle of not greater than 5° with respect to a {0001} plane.

In addition, polishing, surface treatment, etc. further may be implemented on at least one of the major surfaces of the GaN single-crystal substrate (platelike GaN single-crystal mass). The polishing method and the surface-treatment method are not particularly limited; methods of choice can be adopted.

Next, the elastic-constant matrix [$C_{ij}$] (i.e., elastic constants $C_{11}$, $C_{33}$, $C_{44}$, $C_{66}$, $C_{12}$ and $C_{13}$) for the GaN single-crystal substrate (platelike GaN single-crystal mass) obtained as described above is characterized (Step S13). Herein, the method whereby the elastic-constant matrix [$C_{ij}$] for the GaN single-crystal substrate is characterized is not particularly limited; examples that may be cited include resonant ultrasound spectroscopy (RUS), Brillouin spectroscopy, and surface-acoustic wave measurement. Out of these, RUS is preferable from the perspective of enabling highly accurate measurement. For example, in RUS, under, e.g., a 30° C. ambient temperature, a sample (single-crystal mass) in the form of a rectangular bar or other prescribed shape is sandwiched between two piezoelectric vibrators, through one of which continuous sine-wave vibrations are input, and at the other of which a displacement signal is received. Herein, when the input frequency is swept the received-signal amplitude exhibits peaks at the resonant frequencies of the free vibration of the sample. Numerous resonant peaks exist, with the individual resonant frequencies depending upon the concentration and dimensions of the sample and on its elastic constants. By first measuring the concentration and the dimensions, and then finding, by reverse calculation, the elastic-constant matrix [$C_{ij}$] that gives the resonant-frequency group nearest the measurements, all of the elastic constants $C_{11}$, $C_{33}$, $C_{44}$, $C_{66}$, $C_{12}$ and $C_{13}$ are computed.

Among all of the elastic constants $C_{11}$, $C_{33}$, $C_{44}$, $C_{66}$, $C_{12}$ and $C_{13}$ for 30° C., measured and computed in the aforedescribed Step S13, if at 30° C. the elastic constant $C_{11}$ is from 348 GPa to 365 GPa and the elastic constant $C_{13}$ is from 90 GPa to 98 GPa, or else if the elastic constant $C_{11}$ is from 352 GPa to 362 GPa, a GaN single-crystal substrate—a GaN single-crystal mass of Embodying Mode 1—in which the occurrence of cracks is controlled to a minimum is obtained (Step S14). On the other hand, among all of the elastic constants $C_{11}$, $C_{33}$, $C_{44}$, $C_{66}$, $C_{12}$ and $C_{13}$ for 30° C., measured and computed in Step S13, if at 30° C. the elastic constant $C_{11}$ is not from 348 GPa to 365 GPa and the elastic constant $C_{13}$ is not from 90 GPa to 98 GPa, or else if the elastic constant $C_{11}$ is not from 352 GPa to 362 GPa, the obtained GaN single-crystal substrate (platelike GaN single-crystal mass) is susceptible to cracking, and consequently is stowed in a separate area or discarded.

As detailed in the foregoing, in a method of manufacturing GaN single-crystal substrates in the present embodying mode, implementing above-described Steps S11 through S14 makes it possible to manufacture the GaN single-crystal mass of Embodying Mode 1.

Embodying Mode 3

Figure 3:
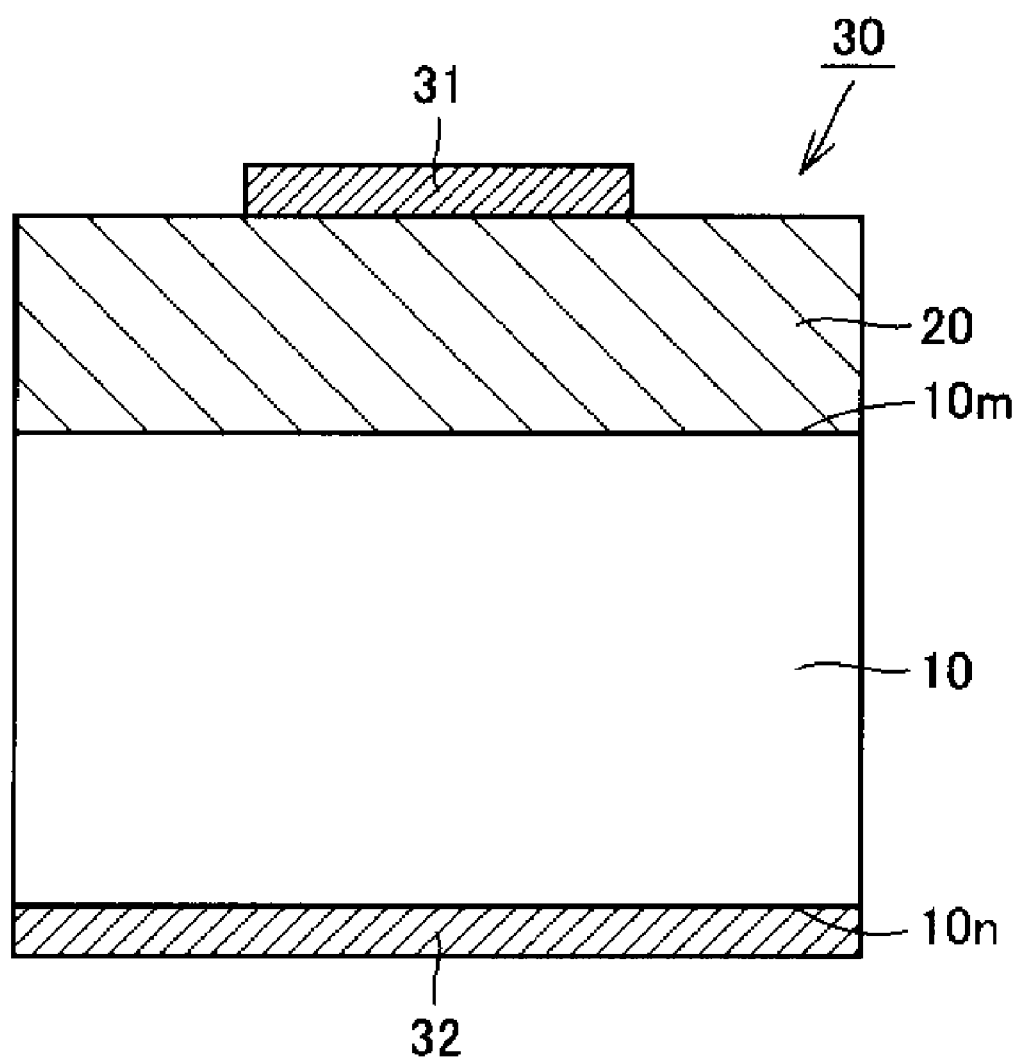
FIG. 3 is a simplified sectional diagram representing an example of a semiconductor device.

With reference to FIG. 3, a semiconductor device 30 that is one mode of embodying the present invention includes a GaN single-crystal mass 10 of Embodying Mode 1, and an at least single-lamina III-nitride semiconductor layer 20 formed onto the GaN single-crystal mass 10. Because the semiconductor device 30 in the present embodying mode incorporates the GaN single-crystal mass 10 of Embodying Mode 1, the occurrence of cracks is extremely slight.

The semiconductor device 30 represented in FIG. 3 is, specifically, a Schottky barrier diode (SBD), and includes: a GaN single-crystal substrate (platelike GaN single-crystal mass 10); an $Al_xIn_yGa_{1-x-y}N$ (0≦x, 0≦y, x+y≦1) layer (III-nitride semiconductor layer 20) formed onto one of the major surfaces, 10$m$, of the GaN single-crystal substrate (platelike GaN single-crystal mass 10); a Schottky contact 31 formed onto the $Al_xIn_yGa_{1-x-y}N$ layer (III-nitride semiconductor layer 20); and an ohmic contact 32 formed onto the other of the major surfaces, 10$n$, of the GaN single-crystal substrate (platelike GaN single-crystal mass 10).

Embodying Mode 4

With reference to FIGS. 3 and 4, a method, in one mode of embodying the present invention, of manufacturing the semiconductor device 30 is provided with: Step S10 of preparing a GaN single-crystal mass 10 of Embodying Mode 1; and Step S20 of forming an at least single-lamina III-nitride semiconductor layer 20 onto the GaN single-crystal mass 10. In accordance with a semiconductor-device manufacturing method of the present embodying mode, the fact that the at least single-lamina III-nitride semiconductor layer 20 is formed onto a GaN single-crystal mass 10 of Embodying Mode 1, makes it possible to minimize cracking in the GaN single-crystal mass 10 and in the III-nitride semiconductor layer 20 during manufacture of the semiconductor device, and therefore heightens semiconductor-device yields.

With reference to FIGS. 3 and 4, a Schottky-barrier diode manufacturing method that is one example of a method, in one mode of embodying the present invention, of manufacturing the semiconductor device 30 is as follows. To begin with, a GaN single-crystal mass 10 of Embodying Mode 1 is prepared (Step S10). Specifically, by means of Steps S11, S12, S13 and S14, described for the GaN single-crystal manufacturing method of Embodying Mode 2, a GaN single-crystal substrate (platelike GaN single-crystal mass 10) having a wurtzitic crystalline structure, and, at 30° C., whose elastic constant $C_{11}$ is from 348 GPa to 365 GPa and whose elastic constant $C_{13}$ is from 90 GPa to 98 GPa, or whose elastic constant $C_{11}$ is from 352 GPa to 362 GPa is prepared.

Next, onto the one major surface 10$m$ of the GaN single-crystal substrate (platelike GaN single-crystal mass 10) an $Al_xIn_yGa_{1-x-y}N$ (0≦x, 0≦y, x+y<1) layer as an at least single-lamina III-nitride semiconductor layer 20 is formed (Step S20). Herein, while the method whereby the III-nitride semiconductor layer 20 is formed is not particularly limited, from the perspective of epitaxially growing a low-dislocation-density, highly crystalline III-nitride semiconductor layer, a vapor-phase growth technique such as HVPE, MBE, MOCVD or sublimation deposition, or a liquid-phase growth technique such as flux growth or high-nitrogen-pressure solution growth is preferably employed.

Next, (Step S30) an ohmic contact 32 is formed onto the major surface 10n on the opposite side of the GaN single-crystal substrate (platelike GaN single-crystal mass 10) from the major surface 10m on which the $Al_xIn_yGa_{1-x-y}N$ layer (III-nitride semiconductor layer 20) has been formed, and a Schottky contact 31 is formed onto the $Al_xIn_yGa_{1-x-y}N$ layer (III-nitride semiconductor layer 20). Herein, the method whereby the Schottky contact 31 and the ohmic contact 32 are formed is not particularly limited; for example, evaporation deposition or a like technique may be cited.

It should be understood that while a Schottky barrier diode (SBD) has been presented and described as an example of a semiconductor device in the present embodying mode, semiconductor devices of the present invention are not limited to SBDs, and may find application as semiconductor devices such as laser diodes (LDs), light-emitting diodes (LEDs), metal-oxide semiconductor field-effect transistors (MOSFETs), junction field-effect transistors (JFETs), p-n diodes, and insulated-gate bipolar transistors (IGBTs).

Embodiment Examples

Embodiment 1

1. Manufacture of GaN Single-Crystal Masses

The HVPE apparatus 100 diagrammed in FIG. 2 was employed to manufacture, in the following manner, a GaN single-crystal substrate (platelike GaN single-crystal mass 10). In detail, the source boat 105 for supplying Ga source material, a GaN substrate as the substrate 11, a carbon plate as the susceptor 108, the local-heating device 115 as a resistive heating device, and a quartz plate, being the quartz component 109 forming the support platform were placed inside the crystal-growth chamber 110 of the HVPE apparatus 100. More precisely, the resistive heating device (local-heating device 115) was set onto the quartz plate (quartz component 109), the carbon plate (susceptor 108) was set onto the local-heating device 115, and a 2-inch (5.08-cm) GaN substrate (substrate 11) of 400 μm thickness was set onto the susceptor 108 (Step S11). The major surface of the GaN substrate (substrate 11) herein was the (0001) plane, and was a Ga-atom face.

Next, (Step S12) GaN single-crystal was grown by HVPE onto the aforementioned major surface of the GaN substrate (substrate 11). In detail, as a first source-material gas, gaseous ammonia of 99.9999 volume % purity, as a second source-material gas, gaseous hydrogen chloride of 99.9999 volume % purity, and as carrier gases, gaseous hydrogen of 99.9999 volume % purity and gaseous nitrogen of 99.9999 volume % purity were prepared. The source boat 105 was charged with metallic Ga (gallium) and installed inside the crystal-growth chamber 110. To begin with, the temperature of the heater 106 was raised to 980° C., and that of the local-heating device 115, to 1150° C. to heat the crystal-growth chamber 110 interior, and the temperature of the source boat 105 was brought to 980° C., and the temperature of the substrate 11 and the quartz plate (quartz component 109), to 1150° C. Herein the temperature of the heater 106 and the local-heating device 115 was a set temperature, while the temperature of the substrate 11 and the quartz plate (quartz component 109) was measured by means of a thermocouple.

Next, the carrier gases were introduced into the crystal-growth chamber 110 through the first gas inlet 103 and the second gas inlet 104. The gaseous HCl (hydrogen chloride), being the second source-material gas, supplied through the second gas inlet 104, and the metallic Ga in the source boat 105 were subject to the reaction $Ga+HCl \rightarrow GaCl+\frac{1}{2}H_2$, thereby generating gaseous GaCl. Subsequently, together with the carrier gases, the gaseous ammonia, being the first source-material gas, supplied through the first gas inlet 104, and the generated gaseous GaCl were flowed so as to strike the major surface 11m of the substrate 11. Along the major surface 11m of the substrate 11 the reaction $GaCl+NH_3 \rightarrow GaN+HCl+H_2$ was caused, which grew a GaN single-crystal mass 10.

Next a slicing operation was carried out to cut from the grown GaN single-crystal mass 10 platelike GaN single-crystal masses (GaN single-crystal substrates) in a manner such that the (0001) planes would be the major surfaces. Both major surfaces of the GaN single-crystal substrates were polished to a mirrorlike finish, and the process-damaged layer was removed. Fifty GaN single-crystal substrates (platelike GaN single-crystal masses) having a 2-inch (5.08-cm) diameter and 400-μm thickness were thereby manufactured. In addition, 20 GaN single-crystal samples in the form of rectangular bars of 2 mm width×4 mm length×2 mm thickness (with the angle of displacement between the thickness direction of the samples and their single-crystal c-axis being less than) 0.3° were sliced from a grown GaN single-crystal mass 10, and their six sides were ground and polished to render the average surface roughness Ra of the sides less than 0.01 μm. Herein, the "average roughness of the surfaces" means the arithmetic mean Ra prescribed in JIS B0601, and was measured using atomic-force microscopy (ATM) within a 10 μm×10 μm plane.

2. Evaluation of GaN Single-Crystal Masses 2-1. Cracking Incidence

The presence or absence of cracking in the 50 GaN single-crystal substrates (platelike GaN single-crystal masses) obtained in the manner just described was verified by the following method. While a white spotlight was cast on the GaN single-crystal substrates, the surface condition of both the major sides was observed visually. Since the spotlight beam is scattered in areas where cracks have arisen along the major surfaces of the GaN single-crystal substrates, the presence or absence of cracks can be determined. By means of such technique, GaN single-crystal substrates in which cracks had been verified were deemed cracking-present, while GaN single-crystal substrates in which no cracks had been verified were deemed cracking-absent. The percentage being the number of GaN single-crystal substrates having crack occurrences with respect to the 50-count number of GaN single-crystal substrates was computed as the cracking incidence (%). The cracking incidence of GaN single-crystal masses of the present embodiment was 2%. The results are tabulated in Table I.

2-2. Measurement of Elastic Constants

The elastic constants $C_{11}$ and $C_{13}$ of the 20 GaN single-crystal mass samples obtained in the manner described above were measured by RUS within a 30° C. ambient temperature. In the present-embodiment GaN single-crystal masses at 30° C., the elastic constants $C_{11}$ were 348 to 354 GPa, while the elastic constants $C_{13}$ were 96 to 98 GPa. The results are tabulated in Table I.

Embodiment 2

1. Manufacture of GaN Single-Crystal Masses

Apart from having the temperature of the source boat be 1020° C., GaN single-crystal masses were manufactured in the same way as in Embodiment 1, and 50 GaN single-crystal substrates and 20 GaN single-crystal samples were fabricated.

2. Evaluation of GaN Single-Crystal Masses

In the same manner as in Embodiment 1, the cracking incidence and the elastic constants were characterized. The cracking incidence in the GaN single-crystal masses of the present embodiment was 0%, and at 30° C., the elastic constants $C_{11}$ were 352 to 362 GPa, while the elastic constants $C_{13}$ were 92 to 95 GPa. The results are tabulated in Table I.

Embodiment 3

1. Manufacture of GaN Single-Crystal Masses

Apart from having the temperature of the source boat be 1040° C., GaN single-crystal masses were manufactured in the same way as in Embodiment 1, and 50 GaN single-crystal substrates and 20 GaN single-crystal samples were fabricated.

2. Evaluation of GaN Single-Crystal Masses

In the same manner as in Embodiment 1, the cracking incidence and the elastic constants were characterized. The cracking incidence in the GaN single-crystal masses of the present embodiment was 4%, and at 30° C., the elastic constants $C_{11}$ were 359 to 365 GPa, while the elastic constants $C_{13}$ were 90 to 92 GPa. The results are tabulated in Table I.

Embodiment 4

1. Manufacture of GaN Single-Crystal Masses

Apart from having the temperature of the source boat be 1020° C., and the temperature of the substrate and the quartz component be 1140° C., GaN single-crystal masses were manufactured in the same way as in Embodiment 1, and 50 GaN single-crystal substrates and 20 GaN single-crystal samples were fabricated.

2. Evaluation of GaN Single-Crystal Masses

In the same manner as in Embodiment 1, the cracking incidence and the elastic constants were characterized. The cracking incidence in the GaN single-crystal masses of the present embodiment was 6%, and at 30° C., the elastic constants $C_{11}$ were 352 to 362 GPa, while the elastic constants $C_{13}$ were 86 to 93 GPa. The results are tabulated in Table I.

COMPARATIVE EXAMPLE 1

1. Manufacture of GaN Single-Crystal Masses

Apart from having the temperature of the substrate and the quartz component be 1130° C., GaN single-crystal masses were manufactured in the same way as in Embodiment 1, and 50 GaN single-crystal substrates and 20 GaN single-crystal samples were fabricated.

2. Evaluation of GaN Single-Crystal Masses

In the same manner as in Embodiment 1, the cracking incidence and the elastic constants were characterized. The cracking incidence in the GaN single-crystal masses of this embodiment example was 24%, and at 30° C., the elastic constants $C_{11}$ were 344 to 347 GPa, while the elastic constants $C_{13}$ were 99 to 100 GPa. The results are tabulated in Table I.

COMPARATIVE EXAMPLE 2

1. Manufacture of GaN Single-Crystal Masses

Figure 5:
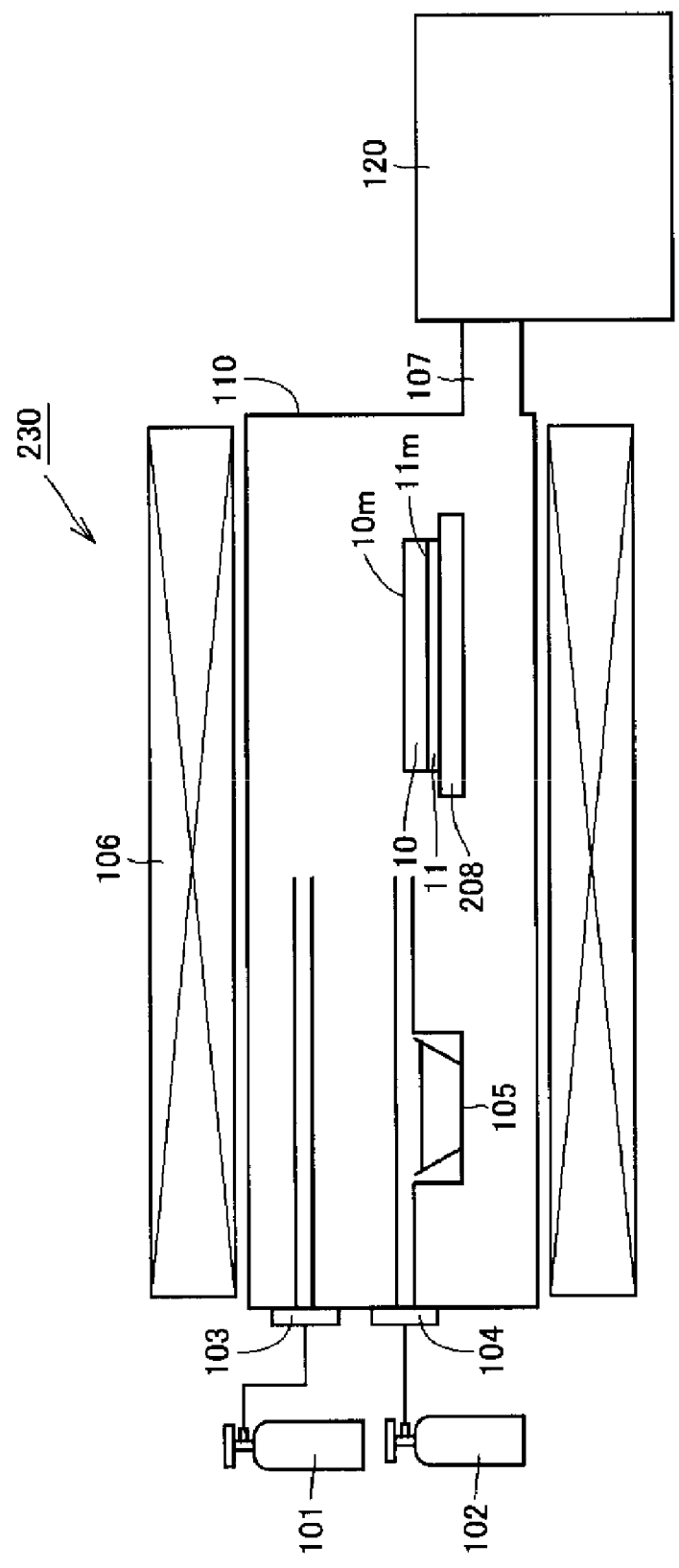
FIG. 5 is a simplified diagram representing a different example of a method of manufacturing a GaN single-crystal mass, and a manufacturing apparatus therefor.

Apart from employing the HVPE apparatus 230 of FIG. 5, in which, in contrast to the HVPE apparatus 100 of FIG. 1, there was no quartz component forming a support platform, and which instead of the susceptor 108 and the local-heating device 115 used a carbon-plate susceptor 208 with a built-in local-heating device, and apart from having the temperature of the substrate be 1130° C., GaN single-crystal masses were manufactured in the same way as in Embodiment 1, and 50 GaN single-crystal substrates and 20 GaN single-crystal samples were fabricated.

2. Evaluation of GaN Single-Crystal Masses

In the same manner as in Embodiment 1, the cracking incidence and the elastic constants were characterized. The cracking incidence in the GaN single-crystal masses of this embodiment example was 48%, and at 30° C., the elastic constants $C_{11}$ were 342 to 345 GPa, while the elastic constants $C_{13}$ were 99 to 102 GPa. The results are tabulated in Table I.

COMPARATIVE EXAMPLE 3

1. Manufacture of GaN Single-Crystal Masses

Figure 6:
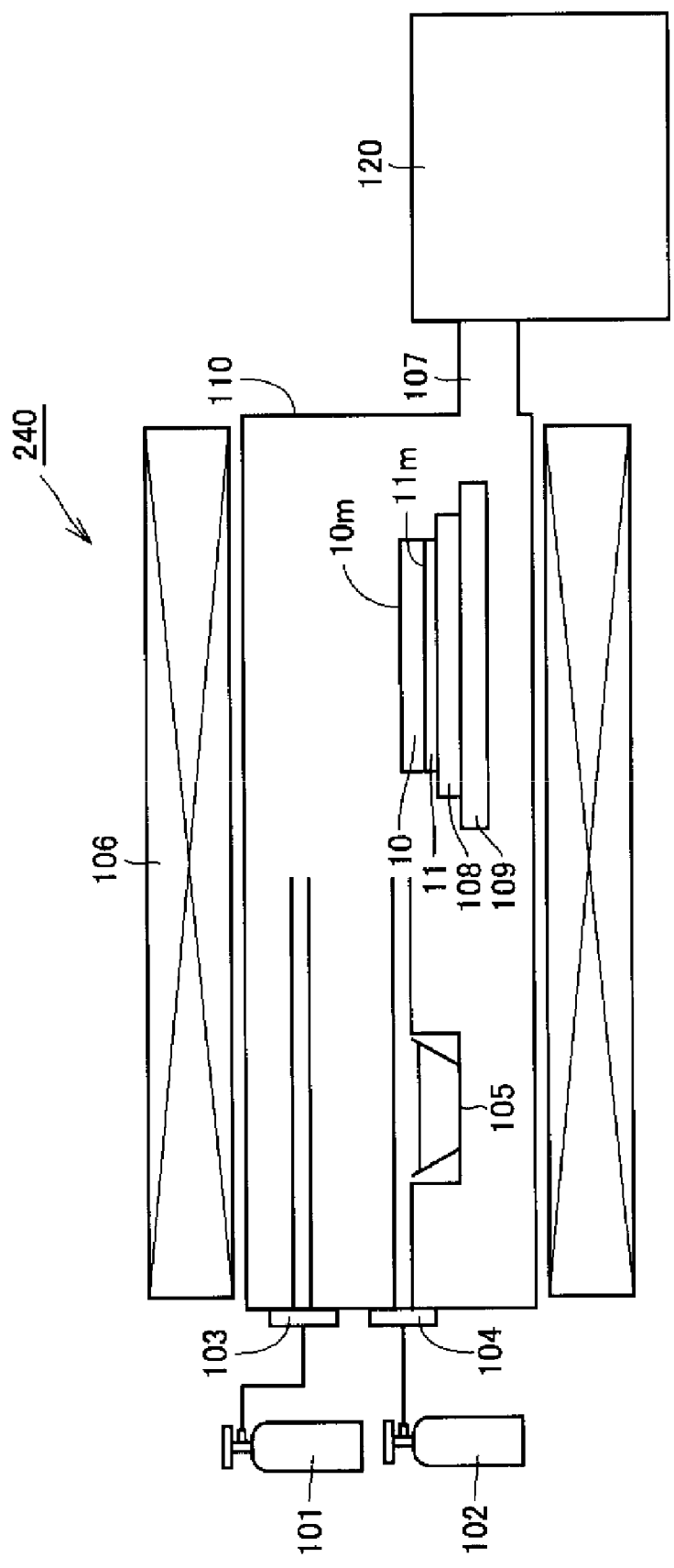
FIG. 6 is a simplified diagram representing a still different example of a method of manufacturing a GaN single-crystal mass, and a manufacturing apparatus therefor.

Apart from employing the HVPE apparatus 240 of FIG. 6, in which, in contrast to the HVPE apparatus 100 of FIG. 1, there was no local-heating device 115, and apart from having the temperature of the source boat be 980° C., the temperature of the substrate be 1080° C., and the temperature of the quartz component be 1080° C., GaN single-crystal masses were manufactured in the same way as in Embodiment 1, and 50 GaN single-crystal substrates and 20 GaN single-crystal samples were fabricated.

2. Evaluation of GaN Single-Crystal Masses

In the same manner as in Embodiment 1, the cracking incidence and the elastic constants were characterized. The cracking incidence in the GaN single-crystal masses of this embodiment example was 52%, and at 30° C., the elastic constants $C_{11}$ were 367 to 378 GPa, while the elastic constants $C_{13}$ were 83 to 88 GPa. The results are tabulated in Table I.

TABLE I

| | Mfg. apparatus | Source-boat temp. (° C.) | Substrate temp. (° C.) | Quartz component temp. (° C.) | Elastic constant $C_{11}$ (GPa) | Elastic constant $C_{13}$ (GPa) | Cracking incidence (%) |
|---|---|---|---|---|---|---|---|
| Emb. 1 | FIG. 2 | 980 | 1150 | 1150 | 348~354 | 96~98 | 2 |
| Emb. 2 | FIG. 2 | 1020 | 1150 | 1150 | 352~362 | 92~95 | 0 |
| Emb. 3 | FIG. 2 | 1040 | 1150 | 1150 | 359~365 | 90~92 | 4 |
| Emb. 4 | FIG. 2 | 1020 | 1140 | 1140 | 352~362 | 86~93 | 6 |
| Comp. Ex. 1 | FIG. 2 | 980 | 1130 | 1130 | 344~347 | 99~100 | 24 |
| Comp. Ex. 2 | FIG. 5 | 980 | 1130 | — | 342~345 | 99~102 | 48 |
| Comp. Ex. 3 | FIG. 6 | 980 | 1080 | 1080 | 367~378 | 83~88 | 52 |

As is evident from Table I, providing a step of placing within the crystal-growth chamber the source boat for supplying the Ga source material, the substrate, and the quartz component, and a step of growing a GaN single-crystal mass by vapor-phase deposition onto the substrate, and in the step of growing the GaN single-crystal mass, holding the temperature of the source boat at from 980° C. to 1040° C., while holding the temperature of the substrate and the quartz component at greater than 1130° C. to not more than 1150° C. yielded GaN single-crystal masses having a wurtzitic crystalline structure, and at 30° C. whose elastic constant $C_{11}$ was from 348 GPa to 365 GPa and whose elastic constant $C_{13}$ was from 90 GPa to 98 GPa, or whose elastic constant $C_{11}$ was from 352 GPa to 362 GPa. With these GaN single-crystal masses, cracking incidence during growth of the GaN single crystal and when the grown GaN single-crystal is processed into plate form was an extremely low 0 to 6%.

The presently disclosed embodying modes and embodiment examples should in all respects be considered to be illustrative and not limiting. The scope of the present invention is set forth not by the foregoing description but by the scope of the patent claims, and is intended to include meanings equivalent to the scope of the patent claims and all modifications within the scope.

Legend

10: GaN single-crystal mass; 10m, 10n, 11m: major surfaces; 11: substrate; 20: III-nitride semiconductor layer; 30: semiconductor device; 31: Schottky contact; 32: ohmic contact; 100, 230, 240: HVPE apparatuses; 101: first gas canister; 102: second gas canister; 103: first gas inlet; 104: second gas inlet; 105: source boat; 106: heater; 107: exhaust port; 108, 208, susceptors; 109: quartz component; 110: crystal-growth chamber; 115: local-heating device; 120: exhaust-gas treatment unit

What is claimed is:

1. A GaN single-crystal mass having a wurtzitic crystalline structure and, at 30° C., whose elastic constant $C_{11}$ is from 348 GPa to 365 GPa and whose elastic constant $C_{13}$ is from 90 GPa to 98 GPa, or whose elastic constant $C_{11}$ is from 352 GPa to 362 GPa.

2. The GaN single-crystal mass set forth in claim 1, wherein its resistivity is not greater than $1 \times 10^3$ Ω·cm.

3. The GaN single-crystal mass set forth in claim 1, wherein the mass is a freestanding substrate.

4. A semiconductor device including the GaN single-crystal mass of claim 1, and an at least single-lamina III-nitride semiconductor layer formed onto said GaN single-crystal mass.

5. A method of manufacturing a semiconductor device, comprising:
   a step of preparing the GaN single-crystal mass of claim 1; and
   a step of forming an at least single-lamina III-nitride semiconductor layer onto said GaN single-crystal mass.

* * * * *